(12) United States Patent
Nakamura et al.

(10) Patent No.: US 12,274,075 B2
(45) Date of Patent: Apr. 8, 2025

(54) MAGNETIC MEMORY

(71) Applicant: KIOXIA CORPORATION, Tokyo (JP)

(72) Inventors: Shiho Nakamura, Kawasaki Kanagawa (JP); Tsuyoshi Kondo, Kawasaki Kanagawa (JP); Nobuyuki Umetsu, Kawasaki Kanagawa (JP)

(73) Assignee: Kioxia Corporation, Tokyo (JP)

( * ) Notice: Subject to any disclaimer, the term of this patent is extended or adjusted under 35 U.S.C. 154(b) by 436 days.

(21) Appl. No.: 17/845,876

(22) Filed: Jun. 21, 2022

(65) Prior Publication Data
US 2023/0180484 A1 Jun. 8, 2023

(30) Foreign Application Priority Data

Dec. 8, 2021 (JP) ................. 2021-199144

(51) Int. Cl.
*H10N 50/80* (2023.01)
*G11C 5/08* (2006.01)
*H10B 61/00* (2023.01)
*H10N 50/01* (2023.01)

(52) U.S. Cl.
CPC .............. *H10B 61/22* (2023.02); *G11C 5/08* (2013.01); *H10N 50/01* (2023.02); *H10N 50/80* (2023.02)

(58) Field of Classification Search
CPC ......... H10B 61/22; G11C 5/08; G11C 11/161; G11C 11/1673; G11C 11/1675; G11C 11/155; H10N 50/01; H10N 50/80; H10N 50/10
See application file for complete search history.

(56) References Cited

U.S. PATENT DOCUMENTS

| 10,403,381 | B2 | 9/2019 | Quinsat et al. |
| 2006/0279980 | A1 | 12/2006 | Haratani et al. |
| 2015/0380638 | A1 | 12/2015 | Ootera et al. |
| 2017/0069829 | A1 | 3/2017 | Morise et al. |
| 2019/0088712 | A1 | 3/2019 | Kado et al. |

FOREIGN PATENT DOCUMENTS

| JP | 4492052 | B2 | 6/2010 |
| JP | 4900647 | B2 | 3/2012 |
| JP | 2016-009806 | A | 1/2016 |
| JP | 2017-054936 | A | 3/2017 |
| JP | 6271350 | B2 | 1/2018 |
| JP | 2019-054191 | A | 4/2019 |
| JP | 2019-057545 | A | 4/2019 |

*Primary Examiner* — Elias Ullah
(74) *Attorney, Agent, or Firm* — Kim & Stewart LLP

(57) ABSTRACT

A magnetic memory includes first and second wirings, a magnetic memory line including first and second portions and extending along a first direction, the second portion electrically connected to the first wiring, and a first magnetic member electrically connected to the first portion and the second wiring and including first and second magnetic portions each having an annular shape and overlapping an end portion of the first portion of the memory line as viewed from the first direction, a third magnetic portion having a cylindrical shape and extending between an inner end of the first magnetic portion and an inner end of the second magnetic portion, and a fourth magnetic portion having a cylindrical shape and extending between an outer end of the first magnetic portion and an outer end of the second magnetic portion.

19 Claims, 15 Drawing Sheets

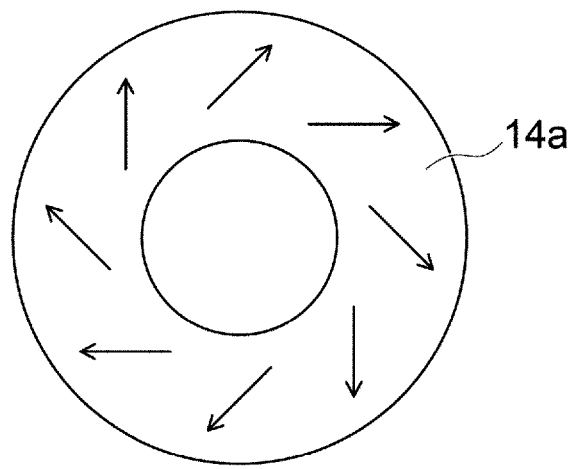
FIG. 8B
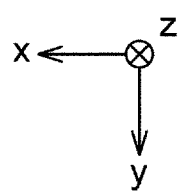
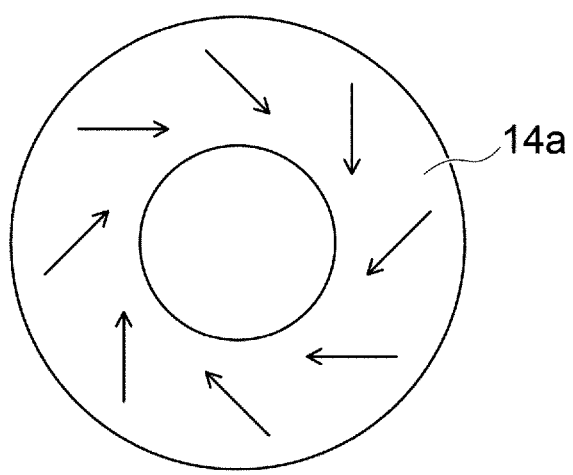
FIG. 8C
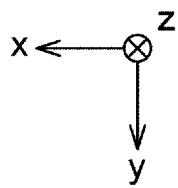

MAGNETIC MEMORY

CROSS-REFERENCE TO RELATED APPLICATION(S)

This application is based upon and claims the benefit of priority from Japanese Patent Application No. 2021-199144, filed Dec. 8, 2021, the entire contents of which are incorporated herein by reference.

FIELD

Embodiments described herein relate generally to a magnetic memory and a manufacturing method thereof.

BACKGROUND

In a known type of magnetic memory, electric current is applied to a magnetic member so that a domain wall displacement (shift) occurs in the magnetic member. If the magnetic member has perpendicular magnetization and is cylindrical, the magnetic field spreads out in a radial fashion and the leakage magnetic field also spreads out in a radial fashion. In this case, a detection element may be unable to detect the leakage magnetic field unless located at a position off the central axis of the magnetic member. On the other hand, if the detection element is located at a position off the central axis of the magnetic member, the current distribution becomes asymmetric, which may lead to the occurrence of a false shift detection in the magnetic member.

BRIEF DESCRIPTION OF THE DRAWINGS

FIGS. 8A through 8C are plan views illustrating a free layer of a magnetoresistive element.

DETAILED DESCRIPTION

Figure 1:
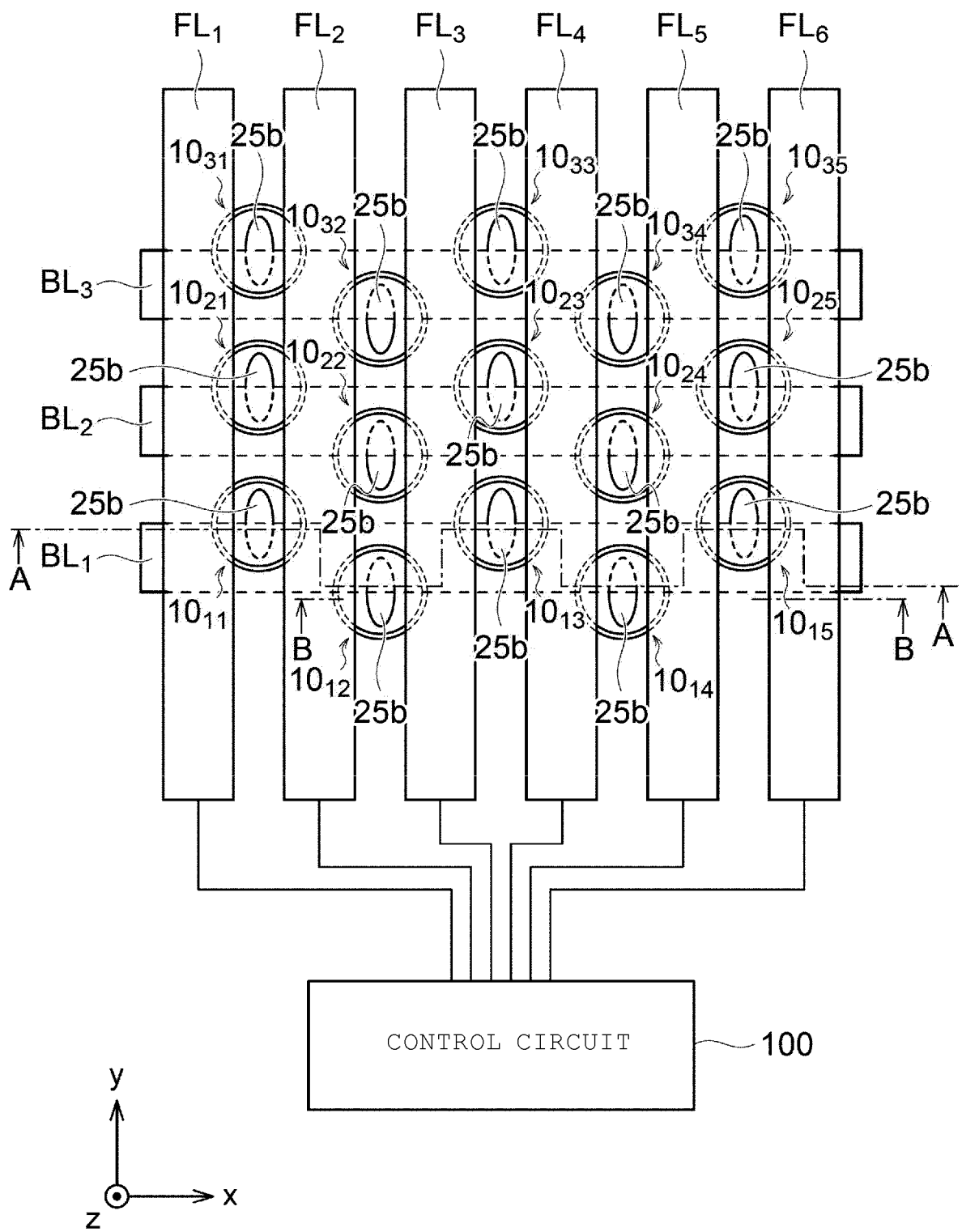
FIG. 1 is a plan view illustrating a magnetic memory according to a first embodiment.

Embodiments provide a magnetic memory capable of improving the accuracy of detection of a magnetic field and thus preventing or reducing a false operation.

In general, according to one embodiment, a magnetic memory includes first and second wirings and a magnetic memory line including first and second portions and extending along a first direction. The second portion is electrically connected to the first wiring. The magnetic memory further includes a first magnetic member electrically connected to the first portion and the second wiring. The first magnetic member includes first and second magnetic portions each having an annular shape and overlapping an end portion of the first portion of the memory line as viewed from the first direction. The first magnetic member further includes a third magnetic portion having a cylindrical shape and extending between an inner end of the first magnetic portion and an inner end of the second magnetic portion. The first magnetic member further includes a fourth magnetic portion having a cylindrical shape and extending between an outer end of the first magnetic portion and an outer end of the second magnetic portion.

Embodiments of the present disclosure will be described below with reference to the drawings. The following embodiments should not be construed to limit the present disclosure. The drawings are schematic and conceptual, and thus ratios and relative dimensions between different portions are not necessarily the ones of an actual implementation. In the specification and the drawings, elements the same or substantially similar to those previously described with reference to prior figures are assigned the same reference characters, and the detailed description thereof might not be repeated.

First Embodiment

Figure 2:
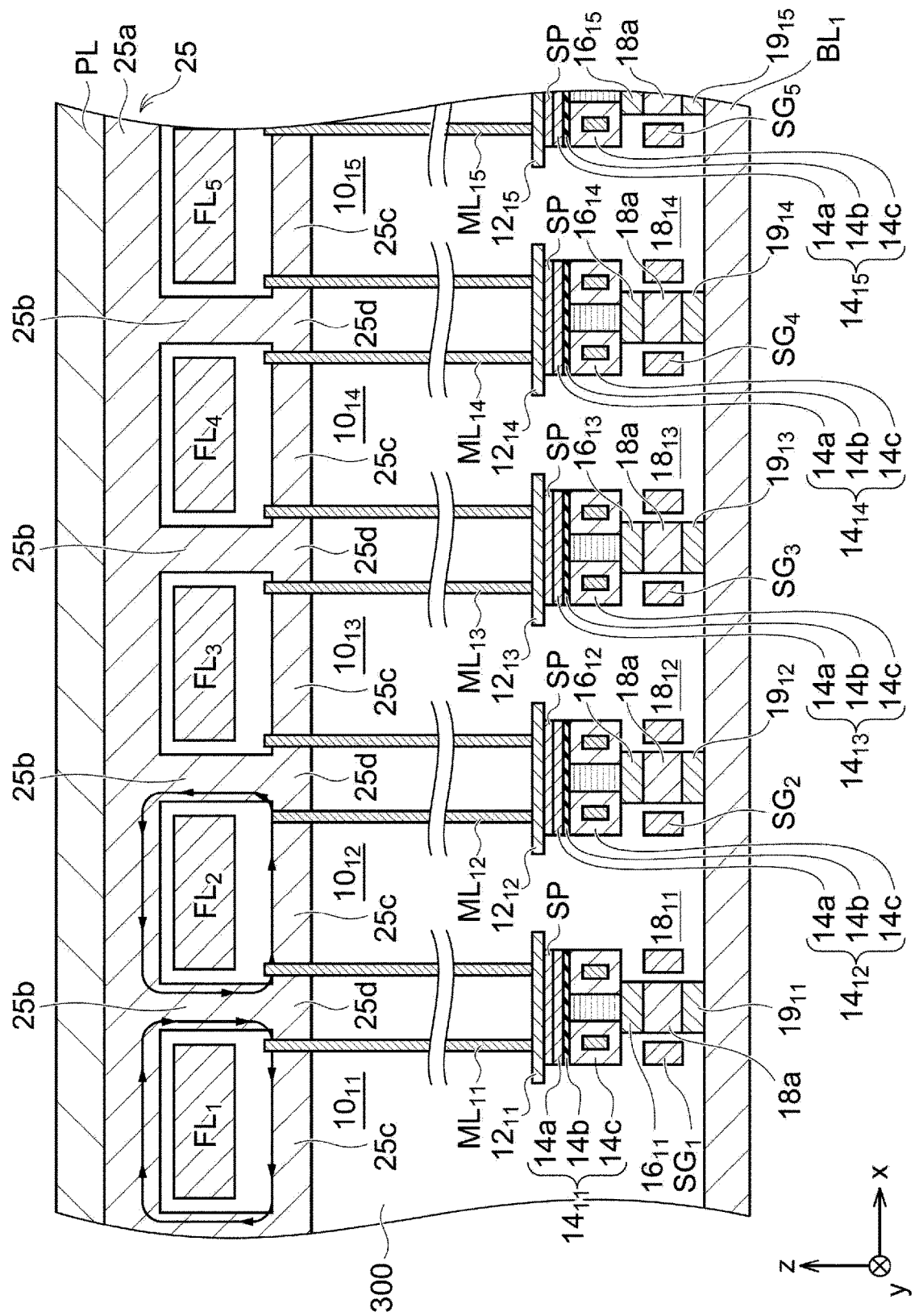
FIG. 2 is a cross-sectional view taken along section line A-A illustrated in FIG. 1.
Figure 3:
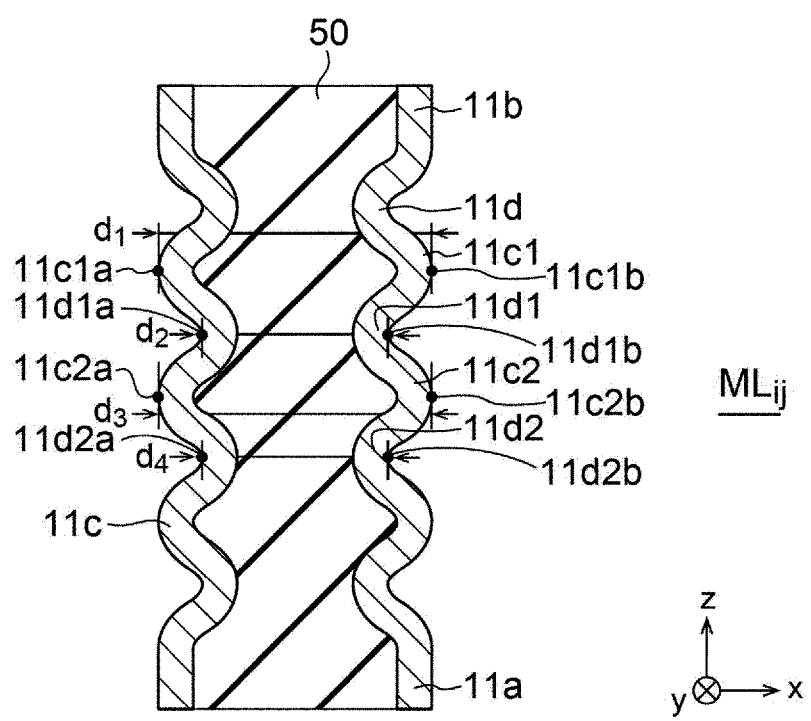
FIG. 3 is a cross-sectional view illustrating a magnetic member.

FIG. 1 is a plan view illustrating a magnetic memory according to a first embodiment. FIG. 2 is a cross-sectional view taken along section line A-A illustrated in FIG. 1. FIG. 3 is a cross-sectional view illustrating a configuration example of a magnetic member of the magnetic memory.

The magnetic memory according to the present embodiment includes memory portions $10_{ij}$ (where i=1, m, and j=1, ... n) arranged in m rows by n columns, where each of m and n is a natural number. Furthermore, in FIG. 1, memory portions $10_{11}$ to $10_{35}$ arrayed in 3 rows by 5 columns are illustrated.

Memory portions $10_{i1}$ to $10_{in}$ in the i-th row (where i=1, ... m) are arranged along a bit line $BL_i$ extending in the x-direction, and one end of each of the memory portions $10_{i1}$ to $10_{in}$ is electrically connected to the bit line $BL_i$. In the present specification, the phrase "A and B are electrically connected to each other" means that A and B are either directly connected to each other or indirectly connected to each other via, for example, an electrical conductor, a magnetoresistive element, or a switching element (including, for example, a transistor or a two-terminal non-linear element). In the i-th row (where i=1, ... m), memory portions $10_{i1}$, $10_{i3}$, ... in odd-numbered columns and memory portions $10_{i2}$, $10_{i4}$, ... in even-numbered columns are arranged out of alignment with each other in the up-down direction (the y-direction) on the drawing sheet. For example, a memory portion $10_{i2}$ (where i=1, ... m) in an even-numbered column is disposed between a memory portion $10_{i1}$ and a memory portion $10_{i3}$ and out of alignment at the lower side of the memory portions $10_{i1}$ and $10_{i3}$ on the drawing sheet. Employing such an arrangement enables densely arranging a plurality of memory portions and thus attaining integration.

With respect to each of memory portions $10_{1j}$, ... $10_{mj}$ arranged in the j-th column (where j=1, ... n), two field lines $FL_j$ and $FL_{j+1}$ are provided. The field line $FL_{j+1}$ (where j=1, ... n−1) is disposed above regions between memory portions $10_{ij}$ (where i=1, ... m) in the j-th column and memory portions $10_{ij+1}$ in the (j+1)-th column. The field line $FL_{j+1}$ (where j=1, ... n−1) may be disposed in such a way as to overlap a part of each of memory portions $10_{ij}$ (where i=1, ... m) in the j-th column and overlap a part of each of memory portions $10_{ij+1}$ (where i=1, ... m) in the (j+1)-th column.

For example, with respect to memory portions $10_{i2}$ (where i=1, ... m) arranged in the second column, a field line $FL_2$ and a field line $FL_3$ are provided. The field line $FL_2$ is disposed above regions between memory portions $10_{i1}$ (where i=1, ... m) in the first column and memory portions $10_{i2}$ in the second column. Moreover, the field line $FL_2$ may be disposed in such a way as to overlap a part of each of memory portions $10_{i1}$ (where i=1, ... m) in the first column and overlap a part of each of memory portions $10_{i2}$ (where i=1, ... m) in the second column. Each of the field lines $FL_j$ (where j=1, ... n+1) extends along the y-direction and intersects with each of the bit lines $BL_i$ (where i=1, ... m). Then, each of the field lines $FL_j$ (where j=1, ... n+1) is connected to and controlled by a control circuit 100. Moreover, each of the bit lines $BL_i$ (where i=1, ... m) is also connected to and controlled by the control circuit 100.

As illustrated in FIG. 2, a yoke 25a is disposed above the memory portions $10_{ij}$ (where i=1, ... m, and j=1, ... n). The yoke 25a is disposed above each of all of the field lines $FL_1$ to $FL_{n+1}$. Moreover, a plate electrode PL electrically connected to the yoke 25a is disposed in such a way as to be in contact with the upper surface of the yoke 25a and cover the upper surface thereof. Moreover, the plate electrode PL is connected to and controlled by the control circuit 100. As a material of each of the yoke 25a and yokes 25b, 25c, and 25d described below, for example, an electrically conductive soft magnetic substance (for example, permalloy) or a material containing an electrically conductive soft magnetic substance can be used. Moreover, as the material of each of the yokes 25a, 25b, 25c, and 25d, a material having a granular structure in which magnetic particles are densely dispersed in an insulator matrix may be used. The yoke 25a may concurrently serve as the plate electrode PL.

Each of the memory portions $10_{ij}$ (where i=1, ... m, and j=1, ... n) includes, as illustrated in FIG. 2, a magnetic memory line (magnetic member) $ML_{ij}$ configured with an electrically conductive magnetic substance, a non-magnetic conductive layer $12_{ij}$, a magnetoresistive element $14_{ij}$, a non-magnetic conductive layer $16_{ij}$, a vertical thin film transistor $18_{ij}$, and a non-magnetic conductive layer $19_{ij}$.

Each magnetic member $ML_{ij}$ (where i, j=1, ... 4) comprises a perpendicular magnetization magnetic material extending along the up-down direction (the z-direction) in FIG. 2 and has a cylindrical shape. When viewed from the z-direction, each magnetic member $ML_{ij}$ may be approximately circular, approximately elliptical, or approximately polygonal. Each magnetic member $ML_{ij}$ (where i, j=1, ... 4) may include, inside a cylinder thereof, a non-magnetic insulator 50 as illustrated in FIG. 3. Thus, each magnetic member $ML_{ij}$ (where i, j=1, ... 4) may be provided in such a way as to surround the non-magnetic insulator 50. In each magnetic member $ML_{ij}$ (where i=1, ... m, and j=1, ... n), as illustrated in FIG. 3, a region 11c1, a constricted portion 11d1, a region 11c2, and a constricted portion 11d2 are arranged along the z-direction. The numbers of these regions and constricted portions are not limited to the numbers illustrated in FIG. 3. When the length (diameter distance) between an end portion 11c1a and an end portion 11c1b of the region 11c1 in the x-direction in a cross-section taken along a plane parallel to the z-direction of the region 11c1 is denoted by d1, the length (diameter distance) between an end portion 11d1a and an end portion 11d1b of the constricted portion 11d1 in the x-direction in a cross-section taken along a plane parallel to the z-direction of the constricted portion 11d1 is denoted by d2, the length (diameter distance) between an end portion 11c2a and an end portion 11c2b of the region 11c2 in the x-direction in a cross-section taken along a plane parallel to the z-direction of the region 11c2 is denoted by d3, and the length (diameter distance) between an end portion 11d2a and an end portion 11d2b of the constricted portion 11d2 in the x-direction in a cross-section taken along a plane parallel to the z-direction of the constricted portion 11d2 is denoted by d4, each magnetic member $ML_{ij}$ (where i=1, ... m, and j=1, ... n) satisfies the following conditions:

d1>d2, d4, and d3>d2, d4.

In each magnetic member $ML_{ij}$ (where i=1, ... m, and j=1, ... n), a first end portion 11a (illustrated in FIG. 3) is electrically connected to the magnetoresistive element $14_{ij}$ via the non-magnetic conductive layer $12_{ij}$. However, the non-magnetic conductive layer $12_{ij}$ (where i=1, ... m, and j=1, ... n) may be omitted. In such a case, the first end portion 11a of each magnetic member $ML_{ij}$ (where i=1, ... m, and j=1, ... n) is directly connected to the magnetoresistive element $14_{ij}$.

Moreover, in each magnetic member $ML_{ij}$ (where i=1, ... m, and j=1, ... n), a second end portion 11b (illustrated in FIG. 3) is electrically connected to the yoke 25d. The yoke 25d and the yoke 25c are magnetically connected to each other. In the present specification, when A is magnetically connected to B, A and B configure a magnetic circuit and thus magnetic substances are not necessarily in direct contact with each other. The yoke 25c is provided opposite to the yoke 25a, and field lines $FL_1$, ... $FL_{n+1}$ are disposed between the yoke 25a and the yoke 25c. The yoke 25d is disposed at a central portion inside the cylinder of each magnetic member $ML_{ij}$ (where i=1, ... m, and j=1, ... n), is located at the same level as that of the yoke 25c, and is magnetically connected to the yoke 25c. The yoke 25b is disposed between the yoke 25a and the yoke 25d, and the yoke 25a and the yoke 25d are electrically connected to each other and are also magnetically connected to each other. Accordingly, the plate electrode PL is electrically connected in common to each memory portion $10_{ij}$ (where i=1, ... m, and j=1, ... n).

The yoke 25 (the yokes 25a to 25d) forms a magnetic circuit. The magnetic circuit has magnetic gaps provided therein. For example, the yoke 25b has one end connected to the yoke 25a and the other end connected to the yoke 25d. The yoke 25d is electrically connected to the inner surface of an upper end portion of the corresponding magnetic member $ML_{ij}$ (where i=1, ... m, and j=1, ... n). A non-magnetic insulating layer (not illustrated) is disposed on the outer surface of each magnetic member $ML_{ij}$ (where i=1, ... m, and j=1, ... n), and the yoke 25d is magnetically connected to the yoke 25c via such an insulating layer.

The yokes 25a, 25b, 25c, and 25d are disposed, as illustrated in FIG. 2, in such a way as to surround a part of each of the field lines $FL_1$ to $FL_{n+1}$. For example, the yoke 25a is disposed opposite to the upper surface of each field line $FL_j$ (where j=1, ... n+1), thus covering the upper surface thereof, the yoke (also referred to as a "return yoke") 25c is disposed opposite to the lower surface of each field line $FL_j$ (where j=1, ... n+1), and the yoke 25b connects the yoke 25a and the yoke 25d to each other and is disposed lateral to each field line $FL_j$ (where j=1, ... n+1). The yokes 25a, 25b, and 25C do not contact the upper surface of each field line $FL_j$ (where j=1, ... n+1), the lateral surface of each field line $FL_j$ (where j=1, ... n+1), and the lower surface of each field line $FL_j$ (where j=1, ... n+1), respectively.

The magnetoresistive element $14_{ij}$ (where i=1, ... m, and j=1, ... n) is an element used to read out information written in the magnetic member $ML_{ij}$, and is, for example, a magnetic tunnel junction (MTJ) element. In the following description, the magnetoresistive element $14_{ij}$ (where i=1, ... m, and j=1, ... n) is assumed to be an MTJ element. The magnetoresistive element $14_{ij}$ (where i=1, ... m, and j=1, ... n) includes a free layer (in other words, a magnetization free layer) 14a, the magnetization direction of which is variable, a fixed portion (in other words, a magnetization fixed layer) 14c, the magnetization direction of which is fixed, and a non-magnetic insulating layer (in other words, a tunnel barrier layer) 14b, which is disposed between the free layer 14a and the fixed portion 14c. In the magnetoresistive element $14_{ij}$ (where i=1, ... m, and j=1, ... n), the free layer 14a is electrically connected to the first end portion 11a (illustrated in FIG. 3) of the magnetic member $ML_{ij}$ via the corresponding non-magnetic conductive layer $12_{ij}$, and the fixed portion 14c is electrically connected to the corresponding vertical thin film transistor $18_{ij}$ via the corresponding non-magnetic conductive layer $16_{ij}$. The free layer 14a is provided between the first end portion 11a or the region 11c and the fixed portion 14c. Here, the phrase "the magnetization direction is variable" means that, in a read operation such as described below, the magnetization direction can be changed with a leakage magnetic field occurring from the corresponding magnetic member $ML_{ij}$ (where i=1, ... m, and j=1, ... n), and the phrase "the magnetization direction is fixed" means that the magnetization direction is not changeable with a leakage magnetic field occurring from the corresponding magnetic member $ML_{ij}$ (where i=1, ... m, and j=1, ... n). The phrase "electrically connected" includes not only a state of being in direct contact but also a state of being adjacent via a thin-film insulating film which does not substantially limit electrical flows. Accordingly, the free layer 14a and the fixed portion 14c are adjacent to each other via the tunnel barrier layer 14b, but are still to be considered electrically connected to each other in this context.

The vertical thin film transistor $18_{ij}$ (where i=1, ... m, and j=1, ... n) has one end electrically connected to the fixed portion 14c of the magnetoresistive element $14_{ij}$ via the non-magnetic conductive layer $16_{ij}$ and the other end electrically connected to the bit line $BL_i$ via the non-magnetic conductive layer $19_{ij}$. The vertical thin film transistor $18_{ij}$ is provided between the magnetoresistive element $14_{ij}$ and the bit line $BL_i$. Alternatively, the vertical thin film transistor $18_{ij}$ may be provided between the magnetoresistive element $14_{ij}$ and the magnetic member $ML_{ij}$. The vertical thin film transistor $18_{ij}$ includes a channel layer 18a extending in the z-direction and a gate electrode portion $SG_j$ disposed in such a way as to surround or nip the channel layer 18a. Thus, the gate electrode portion $SG_j$ covers at least a part of the channel layer 18a. The channel layer 18a comprises, for example, crystalline silicon. The gate electrode portion $SG_j$ (where j=1, ... n) extends along the y-direction, and is connected to and controlled by the control circuit 100. In the following description, the suffix "ij" accompanied by a reference character is in some cases omitted as appropriate.

Figure 4:
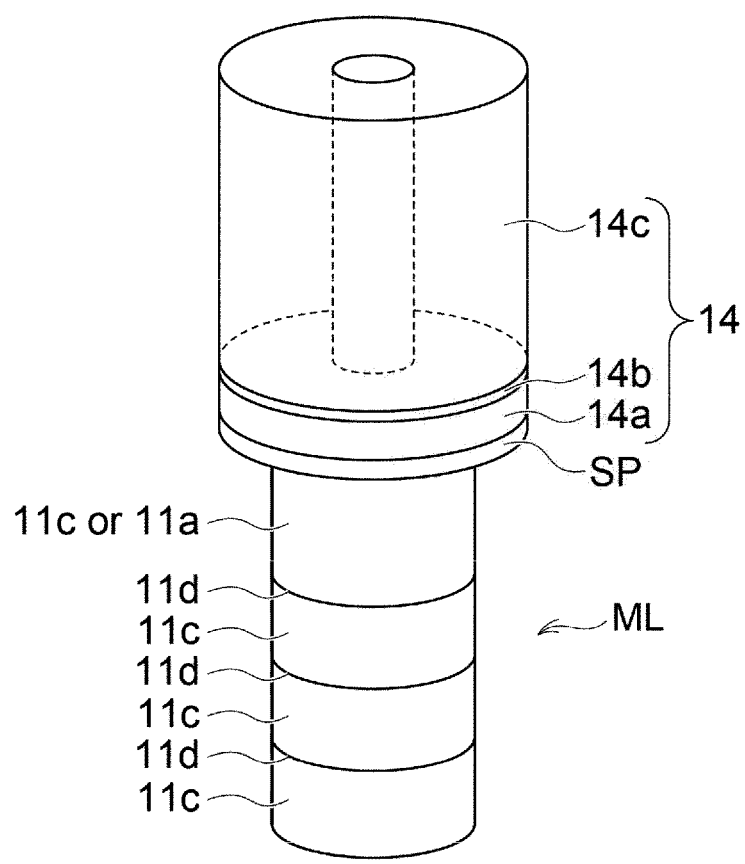
FIG. 4 is a perspective view illustrating a magnetoresistive element and a magnetic member.
Figure 5:
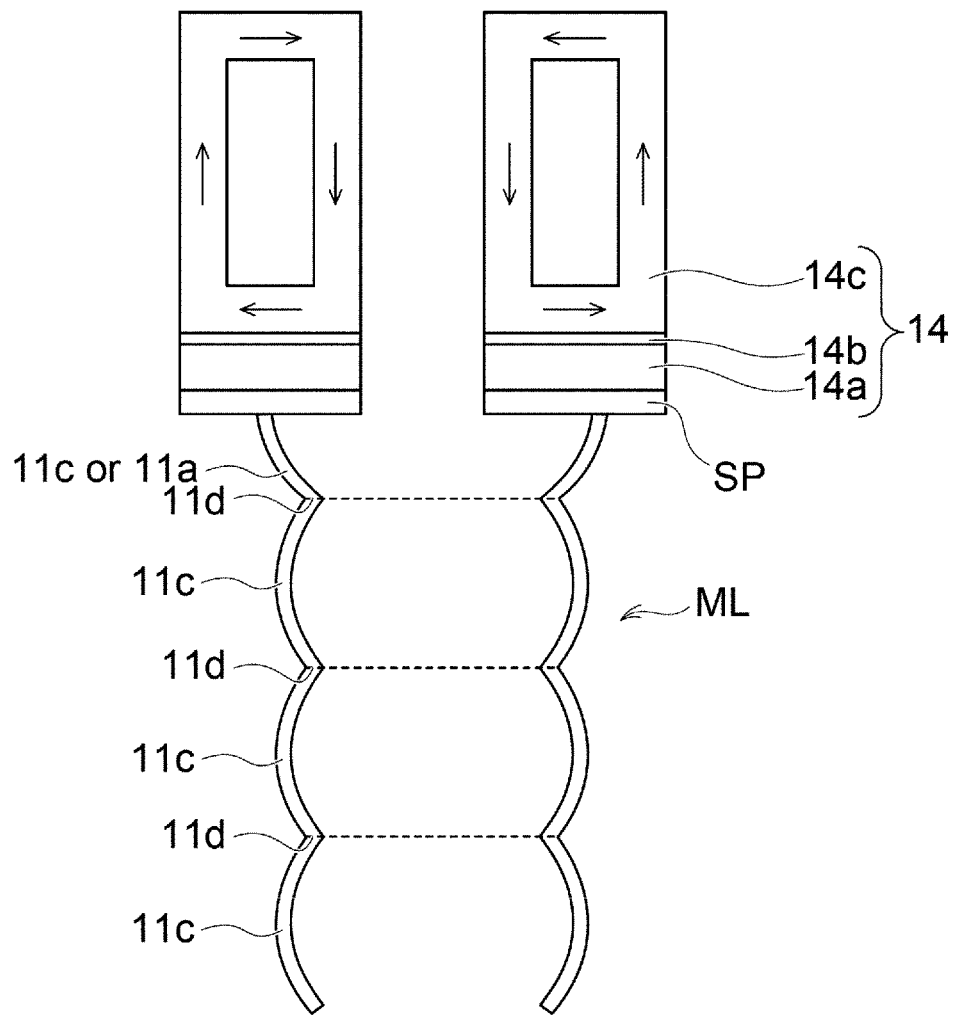
FIG. 5 is a cross-sectional view illustrating a magnetoresistive element and a magnetic member.

FIG. 4 is a perspective view of the magnetoresistive element 14 and the magnetic member ML. FIG. 5 is a cross-sectional view of the magnetoresistive element 14 and the magnetic member ML. Furthermore, in FIG. 4 and FIG. 5, for descriptive purposes, the z-direction is made opposite to the z-direction illustrated in FIG. 2.

In the magnetic member ML, as mentioned above, a plurality of regions 11c is serially interconnected in the z-direction via each constricted portion 11d. Each of the plurality of regions 11c forms, for example, a magnetic domain. A domain wall between magnetic domains is located at, for example, the constricted portion 11d. The magnetic member ML is made from, for example, a material including at least one or more types of 3d transition metal, such as Co, CoFeB, GdFeCo, GdCo, DyCo, Co/Ni multi-layer film, or Co/Pt multi-layer film.

The first end portion 11a of the magnetic member ML or the region 11c adjoining the first end portion 11a is able to serve as a first portion to, in a read operation, apply a leakage magnetic field to the magnetoresistive element 14 and thus change the magnetization direction of the free layer 14a. Hereinafter, the first end portion 11a of the magnetic member ML or the region 11c adjoining the first end portion 11a is also referred to as a "first portion 11c". The second end portion 11b illustrated in FIG. 3 or the region 11c adjoining the second end portion 11b is able to serve as a second portion to, in a write operation, retain the magnetization direction by a magnetic field occurring from a magnetic circuit formed in the yoke 25. Hereinafter, the second end portion 11b or the region 11c adjoining the second end portion 11b is also referred to as a "second portion 11c".

The first portion 11c of the magnetic member ML is connected to a spacer layer SP. The magnetoresistive element 14 is electrically connected to the first portion 11c via the spacer layer SP. The spacer layer SP is an annular non-magnetic conductive material, and has, for example, an annular shape with a hole formed at the center thereof. When viewed from the z-direction, the spacer layer SP overlaps the first portion 11c (the first end portion 11a). The central axis of the spacer layer SP extends in the central axis direction (the z-direction) of the magnetic member ML. When viewed from the z-direction, the central axis of the spacer layer SP may approximately coincide with the central axis of the magnetic member ML, but does not necessarily need to coincide with the central axis of the magnetic member ML. It is favorable that, when viewed from the z-direction, the central axis of the spacer layer SP lies inside the cylinder of the magnetic member ML. Moreover, while it is favorable that the central axis of the spacer layer SP extends in approximately the same direction as the central axis direction of the magnetic member ML, the central axis of the spacer layer SP may be inclined by a certain degree with respect to the central axis of the magnetic member ML. The spacer layer SP does not need to have a hole formed therein. Furthermore, while, in FIG. 5, the non-magnetic conductive layer $12_{ij}$ illustrated in FIG. 2 is not provided, the non-magnetic conductive layer $12_{ij}$ may be provided or does not need to be provided.

Each of the free layer 14a and the tunnel barrier layer 14b between the spacer layer SP and the fixed portion 14c is an annular member, and has, for example, an annular shape with a hole formed at the center thereof. The tunnel barrier layer 14b does not need to have a hole formed therein and may have, for example, a disc-like shape. When viewed from the z-direction, the free layer 14a and the tunnel barrier layer 14b overlap the first portion 11c (the first end portion 11a). The central axes of the free layer 14a and the tunnel barrier layer 14b extend in the central axis direction (the z-direction) of the magnetic member ML. When viewed from the z-direction, the central axes of the free layer 14a and the tunnel barrier layer 14b may approximately coincide with the central axis of the magnetic member ML, but do not necessarily need to coincide with the central axis of the magnetic member ML. It is favorable that, when viewed from the z-direction, the central axes of the free layer 14a and the tunnel barrier layer 14b lie inside the cylinder of the magnetic member ML. Moreover, while it is favorable that the central axes of the free layer 14a and the tunnel barrier layer 14b extend in approximately the same direction as the central axis direction of the magnetic member ML, the central axes of the free layer 14a and the tunnel barrier layer 14b may be inclined by a certain degree with respect to the central axis of the magnetic member ML.

The fixed portion 14c is a hollow annular member, and, for example, has an annular shape with a hole formed at the center thereof and has a cavity in the inside thereof. When viewed from the z-direction, the fixed portion 14c overlaps the first portion 11c (the first end portion 11a). The central axis of the fixed portion 14c extends in the central axis direction (the z-direction) of the magnetic member ML. When viewed from the z-direction, the central axis of the fixed portion 14c may approximately coincide with the central axis of the magnetic member ML, but does not necessarily need to coincide with the central axis of the magnetic member ML. It is favorable that, when viewed from the z-direction, the central axis of the fixed portion 14c lies inside the cylinder of the magnetic member ML. Moreover, while it is favorable that the central axis of the fixed portion 14c extends in approximately the same direction as the central axis direction of the magnetic member ML, the central axis of the fixed portion 14c may be inclined by a certain degree with respect to the central axis of the magnetic member ML.

Figure 6A:
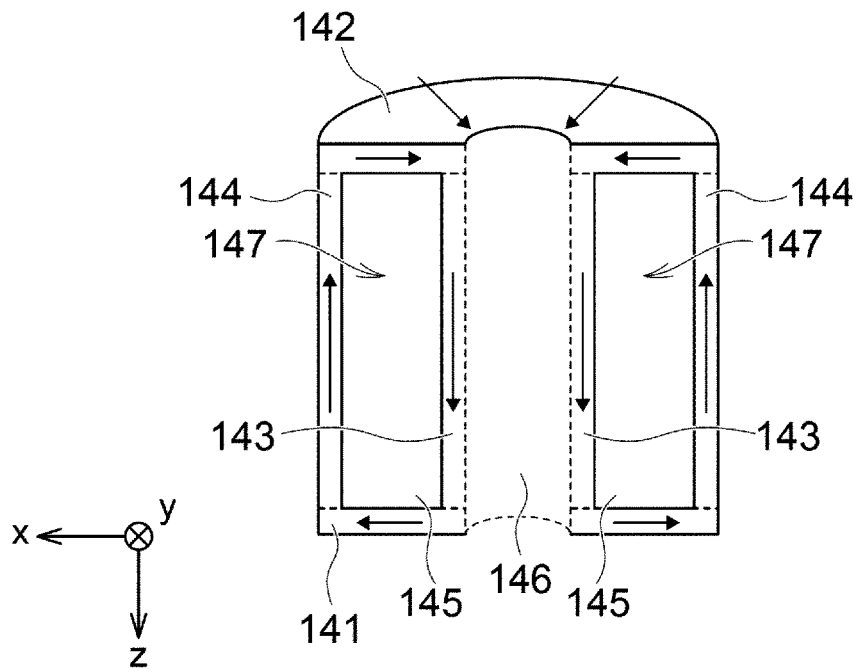
FIGS. 6A and 6B illustrates a fixed portion of a magnetoresistive element.
Figure 7A:
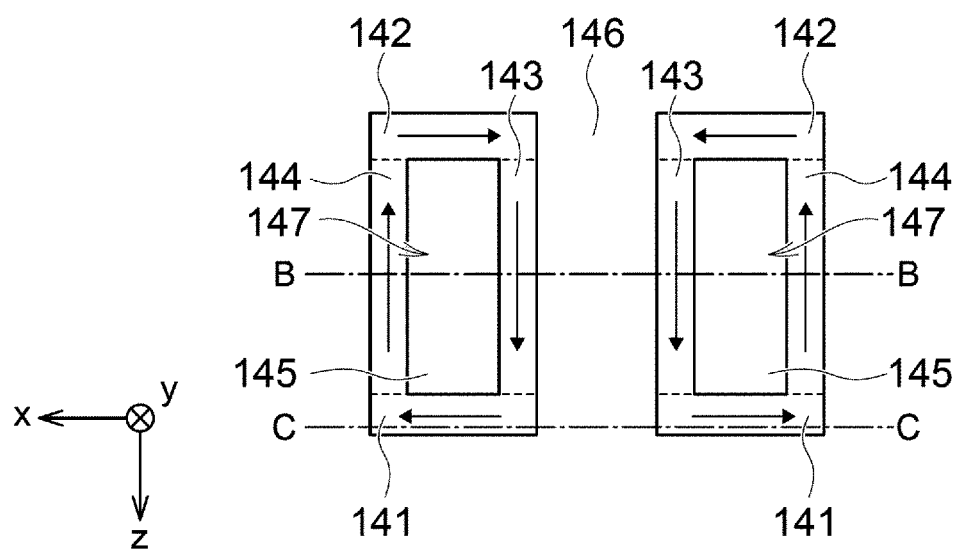
FIGS. 7A through 7C are cross-sectional views illustrating a fixed portion of a magnetoresistive element.
Figure 7B:
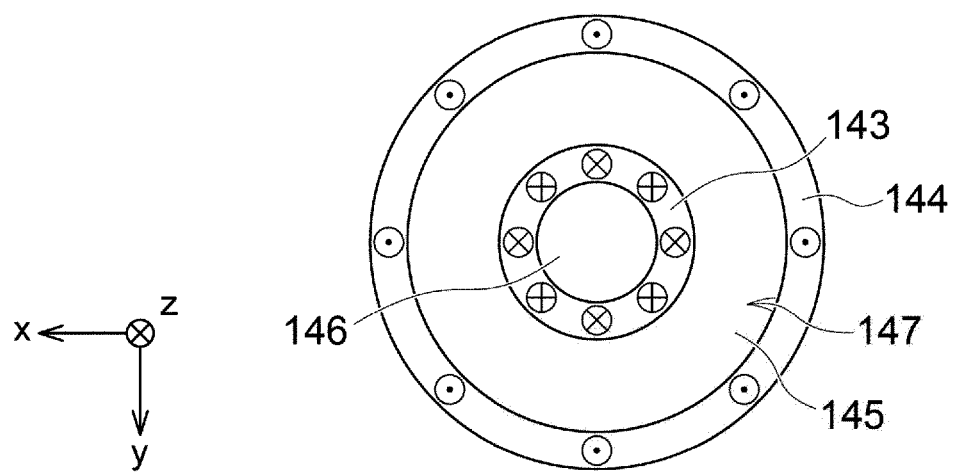
Figure 7C:
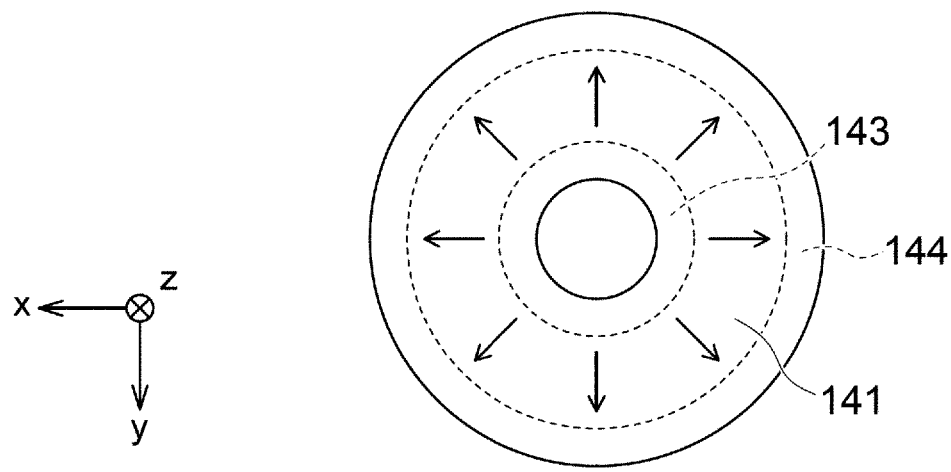

FIG. 6A is a diagram illustrating the fixed portion 14c in more detail. FIG. 6A is a perspective view as viewed from a cross-section obtained by cutting the fixed portion 14c into two portions in the z-direction. FIG. 7A, FIG. 7B, and FIG. 7C are cross-sectional views illustrating the fixed portion 14c. FIG. 7A illustrates a cross-section obtained by cutting the fixed portion 14c in the z-direction. FIG. 7B illustrates a cross-section taken along line B-B in FIG. 7A. FIG. 7C illustrates a cross-section taken along line C-C in FIG. 7A.

The fixed portion 14c includes an annular magnetic substance portion 141, an annular magnetic substance portion 142, a cylindrical magnetic substance portion 143, and a cylindrical magnetic substance portion 144. The fixed portion 14c is made from, for example, a magnetic substance such as permalloy or CoFe.

When viewed from the z-direction, the annular magnetic substance portions 141 and 142 overlap the first portion 11c (the first end portion 11a). The meaning of the phrase "A overlaps B" includes not only a case where A completely overlaps the whole of B but also a case where A overlaps a part of B.

Moreover, it is favorable that, when viewed from the z-direction, the internal surface of the annular magnetic substance portion 141 or 142, which is closer to at least the first portion 11c (the first end portion 11a), lies on the inside (on the side closer to the central axis of the annular magnetic substance portion 141 or 142 or the magnetic member ML) of the internal surface of the first portion 11c (the first end portion 11a) of the magnetic member ML illustrated in FIG. 5. Thus, it is favorable that the inner diameter of the annular magnetic substance portion 141 or 142, which closer to the first portion 11c (the first end portion 11a), is smaller than the inner diameter of the first portion 11c (the first end portion 11a) of the magnetic member ML. On the other hand, it is favorable that the external surface of the annular magnetic substance portion 141 or 142, which is closer to at least the first portion 11c (the first end portion 11a), lies on the outside (on the side away from the central axis of the annular magnetic substance portion 141 or 142 or the magnetic member ML) of the external surface of the first portion 11c (the first end portion 11a) of the magnetic member ML. For example, it is favorable that the outer diameter of the annular magnetic substance portion 141 or 142, which is closer to the first portion 11c (the first end portion 11a), is larger than the outer diameter of the first portion 11c (the first end portion 11a) of the magnetic member ML.

Each of the annular magnetic substance portions 141 and 142 is an annular member, and has, for example, an annular shape with a hole formed at the center thereof. The shapes of the external form and internal form of each of the annular magnetic substance portions 141 and 142 as viewed from the z-direction may be, for example, approximately circular, approximately elliptical, or approximately polygonal. While it is favorable that the shapes of the external form and internal form of each of the annular magnetic substance portions 141 and 142 as viewed from the z-direction are almost equal to each other, such shapes may differ from each other. When viewed from the z-direction, the annular magnetic substance portions 141 and 142 overlap the first portion 11c (the first end portion 11a). The central axes of the annular magnetic substance portions 141 and 142 extend in the central axis direction (the z-direction) of the magnetic member ML. When viewed from the z-direction, the central axes of the annular magnetic substance portions 141 and 142 may approximately coincide with the central axis of the magnetic member ML, but do not necessarily need to coincide with the central axis of the magnetic member ML. It is favorable that, when viewed from the z-direction, the central axes of the annular magnetic substance portions 141 and 142 lie inside the cylinder of the magnetic member ML. Moreover, while it is favorable that the central axes of the annular magnetic substance portions 141 and 142 extend in approximately the same direction as the central axis direction of the magnetic member ML, the central axes of the annular magnetic substance portions 141 and 142 may be inclined by a certain degree with respect to the central axis of the magnetic member ML.

Each of the cylindrical magnetic substance portions 143 and 144 is a cylindrical member, and has, for example, a cylindrical shape with a hole formed at the center thereof. The planar shapes of the cylindrical magnetic substance portions 143 and 144 as viewed from the z-direction may be, for example, approximately circular, approximately elliptical, or approximately polygonal. When viewed from the z-direction, the cylindrical magnetic substance portions 143 and 144 overlap the first portion 11c (the first end portion 11a). The central axes of the cylindrical magnetic substance portions 143 and 144 extend in the central axis direction (the z-direction) of the magnetic member ML. When viewed from the z-direction, the central axes of the cylindrical magnetic substance portions 143 and 144 may approximately coincide with the central axis of the magnetic member ML, but do not necessarily need to coincide with the central axis of the magnetic member ML. It is favorable that, when viewed from the z-direction, the central axes of the cylindrical magnetic substance portions 143 and 144 lie inside the cylinder of the magnetic member ML. Moreover, while it is favorable that the central axes of the cylindrical magnetic substance portions 143 and 144 extend in approximately the same direction as the central axis direction of the magnetic member ML, the central axes of the cylindrical magnetic substance portions 143 and 144 may be inclined by a certain degree with respect to the central axis of the magnetic member ML.

The annular magnetic substance portions 141 and 142 and the cylindrical magnetic substance portions 143 and 144 are made from, for example, a material including at least one or more types of 3d transition metal, such as permalloy, iron, or cobalt iron. The annular magnetic substance portions 141 and 142 and the cylindrical magnetic substance portions 143 and 144 may be made from the same magnetic material, but may also be made from different magnetic materials.

The cylindrical magnetic substance portion 143 makes a connection between the inner end of the annular magnetic substance portion 141 and the inner end of the annular magnetic substance portion 142. The cylindrical magnetic substance portion 144 makes a connection between the outer end of the annular magnetic substance portion 141 and the outer end of the annular magnetic substance portion 142. Thus, the annular magnetic substance portions 141 and 142 are magnetically and electrically connected to each other via the cylindrical magnetic substance portions 143 and 144.

A non-magnetic substance portion 145 is provided in a region 147 surrounded by the annular magnetic substance portions 141 and 142 and the cylindrical magnetic substance portions 143 and 144. The non-magnetic substance portion 145 is made from a non-magnetic conductive material, such as copper, silver, tin, gold, tungsten, tantalum, molybdenum, aluminum, or an alloy of some or all of them.

Figure 6B:
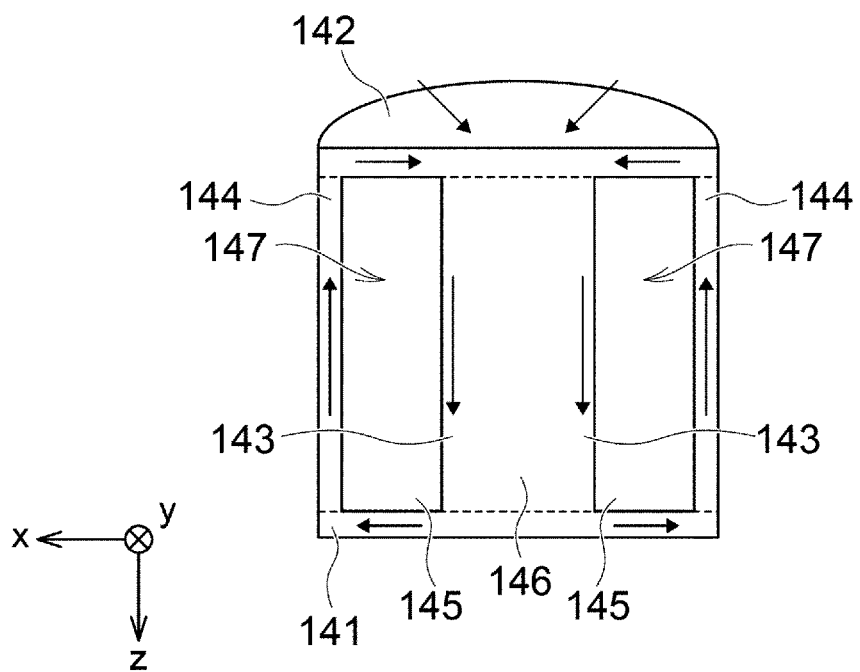

A non-magnetic substance portion 146 is provided inside the cylinder of the cylindrical magnetic substance portion 143. The non-magnetic substance portion 146 is made from, for example, a non-magnetic insulating film, such as a silicon oxide film, aluminum oxide, tantalum oxide, or tungsten oxide. Alternatively, a magnetic substance portion 146 may be provided inside the cylinder of the cylindrical magnetic substance portion 143. The magnetic substance portion 146 may be made from a magnetic insulating film, such as an oxide containing Fe, Co, or Ni. Furthermore, as illustrated in FIG. 6B, a structure obtained by integrating the magnetic substance portion 146 and the cylindrical magnetic substance portion 143 with each other by the same material may be employed. FIG. 6B is a diagram illustrating another configuration example of the fixed portion 14c in more detail. In such a case, the magnetic substance portions 143 and 146 integrated with each other extend in the z-direction in a columnar manner and are connected to the respective inner side portions, for example, central portions, of the magnetic substance portions 141 and 142.

The fixed portion 14c forms a magnetic circuit with the annular magnetic substance portions 141 and 142 and the cylindrical magnetic substance portions 143 and 144, and the magnetization direction thereof is fixed. For example, as illustrated in FIG. 6A to FIG. 7C, the magnetization direction of the fixed portion 14c is fixed. For example, in the annular magnetic substance portion 141, the magnetization direction is a radial direction leading from the center of the annular magnetic substance portion 141 toward the outside thereof. In the annular magnetic substance portion 142, conversely, the magnetization direction is a direction leading from the outside of the annular magnetic substance portion 142 toward the center thereof. A magnetic circuit can be formed even if the magnetization directions are different and slightly inclined from the illustrated directions.

In the cylindrical magnetic substance portion 143, the magnetization direction is the plus z-direction, and, in the cylindrical magnetic substance portion 144, the magnetization direction is the minus z-direction. With these, in a cross-section illustrated in each of FIG. 6A and FIG. 7A, a magnetic circuit surrounding the circumference of the non-magnetic substance portion 145 is formed. A magnetic circuit can be formed even if the magnetization directions are different and slightly inclined from the illustrated directions. With this configuration, the magnetoresistive element 14 changes an electrical resistance between the first end portion 11a of the magnetic member ML and the vertical thin film transistor 18 illustrated in FIG. 2 based on the magnetization direction of the free layer 14a and the magnetization direction of the annular magnetic substance portion 141, which is on the side closer to the free layer 14a.

Figure 8A:
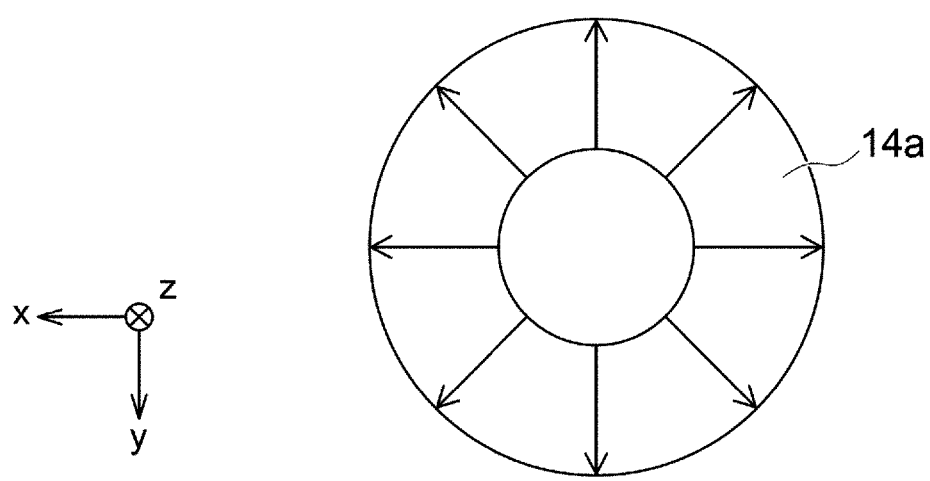

For example, FIG. 8A to FIG. 8C are plan views illustrating the free layer 14a. As illustrated in FIG. 8A, in a case where the magnetization direction of the free layer 14a is a radial direction leading from the center of the free layer 14a toward the outside thereof as with the magnetization direction of the annular magnetic substance portion 141, the magnetization direction of the free layer 14a becomes approximately parallel to and the same direction as the magnetization direction of the annular magnetic substance portion 141, so that the resistance of the magnetoresistive element 14 becomes relatively low.

Although not illustrated, conversely, in a case where the magnetization direction of the free layer 14a is a direction leading from the outside of the free layer 14a toward the center thereof, the magnetization direction of the free layer 14a becomes approximately parallel to and a direction opposite to the magnetization direction of the annular magnetic substance portion 141, so that the resistance of the magnetoresistive element 14 becomes relatively high.

In a case where the magnetization direction of the free layer 14a is almost a circumferential direction, the magnetization direction of the free layer 14a inclines from the circumferential direction according to a leakage magnetic field occurring from the first portion 11c illustrated in FIG. 5. FIG. 8B illustrates a magnetization direction of the free layer 14a obtained when a leakage magnetic field flowing outward from an axial central portion acts on the free layer 14a. FIG. 8C illustrates a magnetization direction of the free layer 14a obtained when a leakage magnetic field flowing from outside toward an axial central portion acts on the free layer 14a. In a case where the magnetization direction of the annular magnetic substance portion 141, which is close to the free layer 14a, is, for example, a direction leading from the axial center toward the outside as illustrated in FIG. 6A, the resistance of the magnetoresistive element 14 becomes relatively small when the magnetization direction of the free layer 14a leads outward as illustrated in FIG. 8B, and becomes relatively large when the magnetization direction of the free layer 14a leads toward the axial center as illustrated in FIG. 8C. In this way, even if the magnetization direction of the free layer 14a has a circumferential component, it is possible to detect recording.

(Write Operation)

Next, a write operation of the magnetic memory according to the present embodiment is described.

For example, a write to the memory cell $10_{ij}$ illustrated in FIG. 2 is performed by, with use of the control circuit 100, causing write currents in directions opposite to each other to flow through two field lines (e.g., a field line $FL_j$ and a field line $FL_{j+1}$). For example, in the case of performing a write to the memory cell $10_{11}$, first, write currents in directions opposite to each other are caused to flow through a field line $FL_2$ and a field line $FL_2$. At this time, when a write current is caused to flow through the field line $FL_1$ in a direction from the near side to the depth side in FIG. 2 and a write current is caused to flow through the field line $FL_2$ in a direction from the depth side to the near side in FIG. 2, a clockwise current magnetic field occurs around the field line $FL_1$ and a counterclockwise current magnetic field occurs around the field line $FL_2$, so that, due to these current magnetic fields, a magnetic field is also induced at the yoke 25 surrounding such field lines. These write currents cause information (stored as a magnetization direction) corresponding to these write currents to be written to an upper portion (the second end portion 11b) of the magnetic member $ML_{11}$ of the memory cell $10_{11}$ located below a space between adjacent field lines, for example, the field line $FL_1$ and the field line $FL_2$. The information (as a magnetization direction) which is written at this time becomes a magnetization direction in a direction parallel to the x-y plane and in a direction leading from the inner circumference of the magnetic member $ML_{11}$ toward the outer circumference thereof.

On the other hand, when the directions of write currents to be caused to flow through the field line $FL_1$ and the field line $FL_2$ are made opposite to those mentioned above, the information which is written to the magnetic member $ML_{11}$ of the memory cell $10_{11}$ becomes a magnetization direction in a direction parallel to the x-y plane and in a direction leading from the outer circumference of the magnetic member $ML_{11}$ toward the inner circumference thereof.

Performing such a write operation causes information to be written to the upper portion (the second end portion 11b) of the magnetic member $ML_{11}$. Next, a shift current for moving the domain wall of the magnetic member $ML_{11}$ is caused by the control circuit 100 to flow between the bit line BL and the plate electrode PL, so that the written information is moved downward and then stored in a storage region (in other words, a shift operation is performed). Furthermore, the polarity of the shift current is determined according to, for example, a material of the magnetic member $ML_{11}$.

(Read Operation)

Next, a read operation is described. In the case of reading information from the memory cell $10_{11}$, when information to be read is located at the lowermost portion of the magnetic member $ML_{11}$ of the memory cell $10_{11}$, (that is, in a region 11c or more particularly the first end portion 11a), which is close to the magnetoresistive element $14_{11}$, since the magnetization direction of the free layer 14a of the magnetoresistive element $14_{11}$ also changes in conformity with the information stored in the lowermost portion of the magnetic member $ML_{11}$, a read current is caused by the control circuit 100 to flow between the bit line BL and the plate electrode PL, so that information is read from the magnetoresistive element $14_{11}$. This read information corresponds to the resistive state of the magnetoresistive element $14_{11}$. A case where the resistive state of the magnetoresistive element $14_{11}$ is high corresponds to, for example, a state in which the respective magnetization directions of the free layer 14a and the fixed portion 14c of the magnetoresistive element $14_{11}$ differ from each other (for example, an antiparallel state), and a case where the resistive state of the magnetoresistive element $14_{11}$ is low corresponds to a state in which the respective magnetization directions of the free layer 14a and the fixed portion 14c of the magnetoresistive element $14_{11}$ are the same (for example, a parallel state).

When information to be read is not located at the lowermost portion of the magnetic member $ML_{11}$ of the memory cell $10_{11}$, a shift current is caused by the control circuit 100 to flow between the bit line BL and the plate electrode PL, so that information to be read is moved in such a way as to become located at the lowermost portion of the magnetic member $ML_{11}$ (in other words, a shift operation is performed). Then, performing the above-mentioned read operation enables reading information.

According to the present embodiment, the magnetoresistive element 14 includes the fixed portion 14c, which comprises the annular magnetic substance portions 141 and 142 and the cylindrical magnetic substance portions 143 and 144 in a cross-section in the z-direction. The fixed portion 14c is not plate-like but has a three-dimensional shape, similar to that of the magnetic member ML. The fixed portion 14c includes the non-magnetic substance portion 145 in the region 147 surrounded by the annular magnetic substance portions 141 and 142 and the cylindrical magnetic substance portions 143 and 144, and thus forms a magnetic circuit with the annular magnetic substance portions 141 and 142 and the cylindrical magnetic substance portions 143 and 144. Therefore, even when the magnetoresistive element 14 is disposed below or above the magnetic member ML in the z-direction, the magnetization direction of the fixed portion 14c is fixed, so that each of the annular magnetic substance portions 141 and 142 is able to stably have a magnetization state which is fixed in a radial direction or a direction opposite thereto. Such a configuration of the fixed portion 14c enables arranging the fixed portion 14c in such a way as to overlap the magnetic member ML as viewed from the z-direction. As a result, currents flowing through the magnetic member ML or the magnetoresistive element 14 have a current distribution approximately axisymmetric with respect to the central axis of the magnetic member ML or the magnetoresistive element 14 at the first end portion 11a of the magnetic member ML, which is close to the magnetoresistive element 14. This enables preventing or reducing a false shift operation for the domain wall in the write operation and the read operation.

The fixed portion 14c forming an annular magnetic circuit illustrated in each of FIG. 5 to FIG. 7C makes it unnecessary to use a material that is low in heatproof temperature (for example, IrMn, PdMn, or FeMn) to fix the magnetization direction. Configuring an annular magnetic circuit enables stabilizing the magnetization direction. Accordingly, in a manufacturing process, heat resistance is improved and the degree of freedom in manufacturing is increased. For example, after formation of the fixed portion 14c, low-temperature polycrystalline silicon (LTPS) can be used as the vertical thin film transistor 18 for a channel.

Moreover, the fixed portion 14c forming a reflux-type magnetic circuit makes a leakage magnetic field occurring from the fixed portion 14c smaller. Accordingly, an influence which a leakage magnetic field occurring from the fixed portion 14c exerts on the free layer 14a or the magnetic member ML is small, so that this enables the free layer 14a to easily and accurately detect a leakage magnetic field occurring from the magnetic member ML and also enables preventing or reducing a false shift operation for the domain wall in the magnetic member ML.

Even if, in the x-y plane, the magnetoresistive element 14 is somewhat relatively out of alignment with the magnetic member ML, as long as the central axis of the magnetoresistive element 14 lies inside the cylinder of the magnetic member ML, the current distribution is able to maintain approximate axial symmetry with respect to the central axis of the magnetic member ML or the magnetoresistive element 14. Therefore, in a planar layout, the magnetoresistive element 14 may be somewhat relatively out of alignment with the magnetic member ML. Similarly, the central axis of the magnetoresistive element 14 may be somewhat relatively inclined with respect to the central axis of the magnetic member ML.

The free layer 14a has also a shape similar to that of the magnetic member ML in a cross-section perpendicular to the z-direction and is located below or above the magnetic member ML. The free layer 14a is disposed in such a way as to overlap the magnetic member ML as viewed from the z-direction. Therefore, the free layer 14a is able to receive, at its entirety, a leakage magnetic field occurring from the first end portion 11a of the magnetic member ML or the region 11c closest to the first end portion 11a and is able to easily and accurately detect the leakage magnetic field. Thus, although the magnetic member ML is cylindrical, the magnetoresistive element 14 according to the present embodiment is able to sufficiently use a leakage magnetic field occurring from the magnetic member ML to detect the leakage magnetic field.

Even if, in the x-y plane, the magnetoresistive element 14 is somewhat relatively out of alignment with the magnetic member ML, as long as the central axis of the free layer 14a lies inside the cylinder of the magnetic member ML, the free layer 14a is able to receive, almost at its entirety, a leakage magnetic field occurring from the region 11c in a radial direction or a direction opposite thereto. Therefore, even if, in a planar layout, the magnetoresistive element 14 is somewhat relatively out of alignment with the magnetic member ML, the magnetoresistive element 14 is still able to easily and accurately detect the leakage magnetic field.

Additionally, since the fixed portion 14c is disposed in such a way as to overlap the magnetic member ML as viewed from the z-direction, the layout area of the entire magnetic memory is small.

(Manufacturing Method)

Next, a manufacturing method for a magnetic memory is described. FIG. 9 to FIG. 19 are cross-sectional views illustrating a manufacturing method for the magnetic memory according to a first embodiment.

Figure 9:
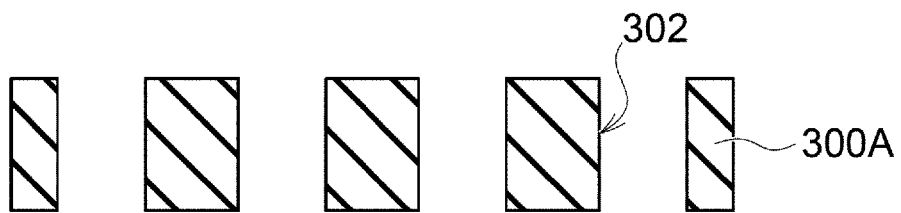
FIGS. 9 through 19 are cross-sectional views illustrating a manufacturing method for a magnetic memory according to a first embodiment.

First, the manufacturing method forms a metallic layer 300 made from, for example, aluminum on a silicon substrate (not illustrated), or bonds a substrate made from aluminum to a silicon substrate. Next, the manufacturing method performs anodization on the metallic layer 300. The anodization is performed by setting the metallic layer 300 or the substrate as an anode and supplying electricity to the metallic layer 300 or the substrate in an electrolyte solution (for example, any one of sulfuric acid, oxalic acid, and phosphoric acid or a mixture of some or all of them). At this time, the metallic layer 300 or the substrate (containing aluminum or the like) is oxidized into metal ions and is thus dissolved. The metal ions are bound with oxygen in the electrolyte solution and thus become a metal oxide (e.g., aluminum oxide), which remains on the surface of the metallic layer 300 and progressively grows. In this way, with dissolution and growth progressing simultaneously, minute holes 302 surrounded by aluminum oxide or the like are produced on the surface of the metallic layer 300. At the time of production of the holes 302, the manufacturing method periodically applies a second voltage different from a first voltage which is applied for production of the holes. During a period in which the second voltage is being applied, a constricted portion 11d (see FIG. 5), which is small in dimension in the x-direction and y-direction illustrated in FIG. 2, is formed. Furthermore, the neighborhood of a region with the hole 302 formed therein changes from the metallic layer 300 (for example, aluminum) to a metallic oxide layer 300A (for example, aluminum oxide). With this process, a structure illustrated in FIG. 9 is formed.

Figure 10:
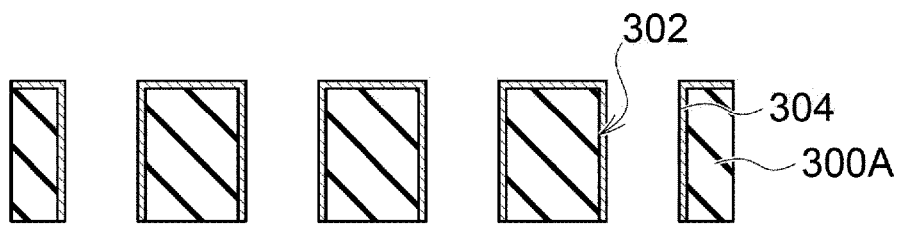
Figure 11:
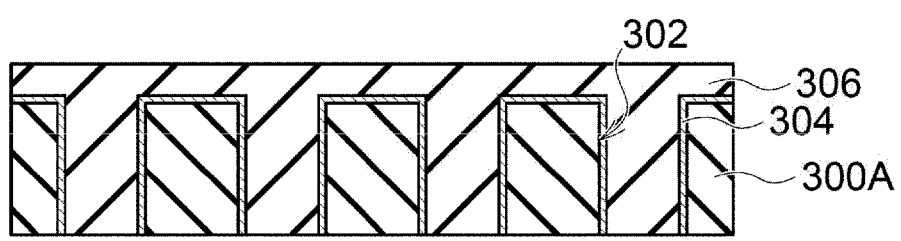

Next, as illustrated in FIG. 10, the manufacturing method forms a magnetic layer 304 in such a way as to cover the inner surface of the hole 302. The magnetic layer 304 becomes a magnetic member ML illustrated in FIG. 5. Next, as illustrated in FIG. 11, the manufacturing method forms a non-magnetic insulating film (for example, a silicon oxide film) 306 in such a way as to embed the hole 302 therein.

Figure 12:
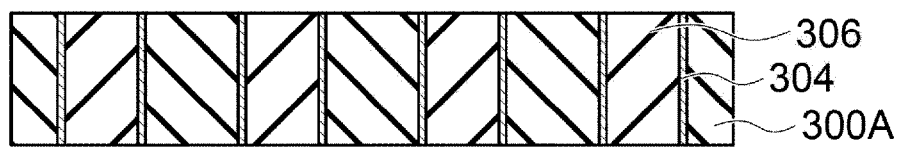

Next, as illustrated in FIG. 12, the manufacturing method planarizes the insulating film 306, with use of a chemical mechanical polishing (CMP) method, until the surface of the metallic oxide layer 300A is exposed.

Figure 13:
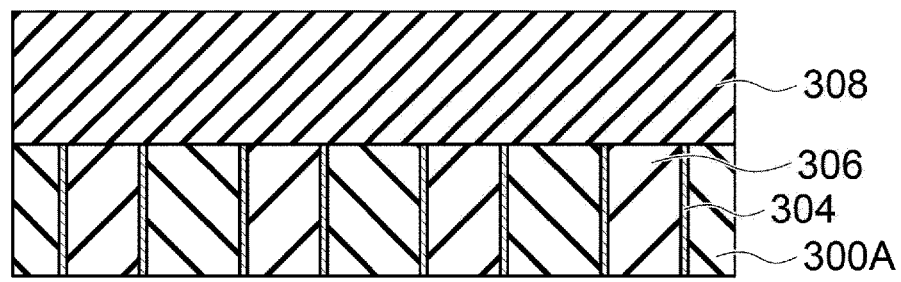

Next, as illustrated in FIG. 13, the manufacturing method forms, with use of an ALD method or a chemical vapor deposition (CVD) method, an insulating film 308 on the metallic oxide layer 300A and the insulating film 306.

Figure 14:
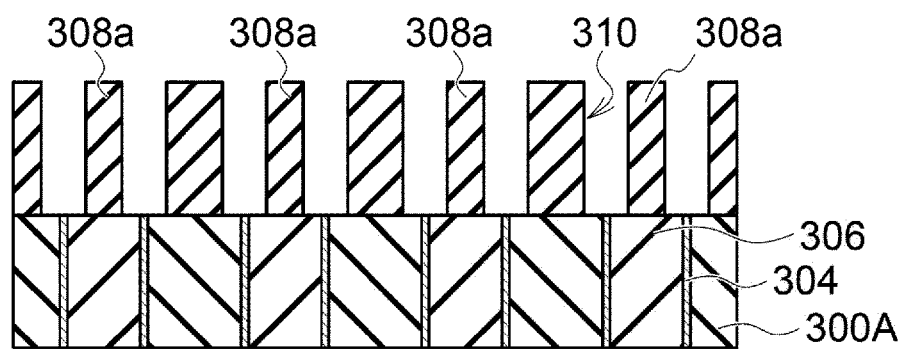

Next, as illustrated in FIG. 14, the manufacturing method forms, with use of a lithographic technique and an etching technique, holes 310 in the insulating film 308. Each hole 310 is formed in a cylindrical shape in such a way as to lie directly on the insulating film 306, and a columnar portion 308a remains at the central portion of the hole 310. When viewed from the z-direction, the hole 310 is annular (in other words, doughnut-like). The fixed portion 14c is to be formed in the hole 310 in a later process. Therefore, the hole 310 is provided in conformity with the fixed portion 14c.

Figure 15:
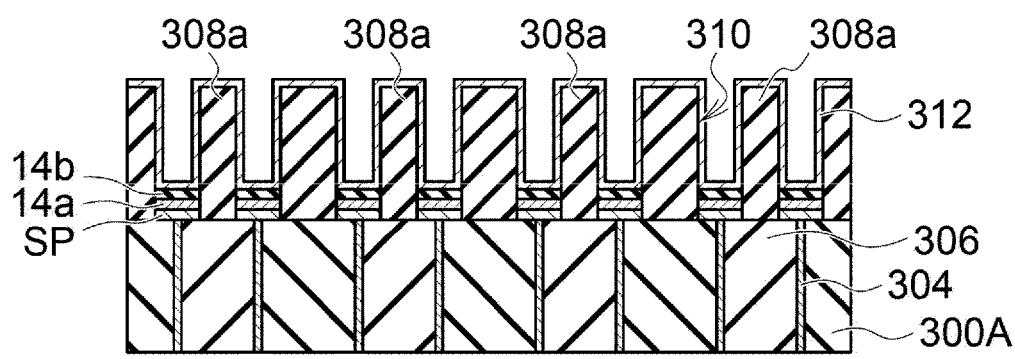

Next, as illustrated in FIG. 15, the manufacturing method deposits, with use of, for example, a sputtering method having high directive property (anisotropy), the spacer layer SP, the free layer 14a, and the tunnel barrier layer 14b at the bottom of the hole 310. Since the hole 310 is formed in a cylindrical shape centered on the columnar portion 308a, the bottom of the hole 310 is annular. The spacer layer SP, the free layer 14a, and the tunnel barrier layer 14b are also formed in an annular shape in such a way as to fit into the shape of the bottom of the hole 310. The spacer layer SP is made from, for example, a metallic material, such as copper, tantalum, tungsten, ruthenium, or molybdenum. The free layer 14a is made from, for example, an alloy containing an element selected from among cobalt, nickel, iron, platinum, palladium, magnesium, and rare-earth elements. The tunnel barrier layer 14b is made from, for example, an insulating film, such as magnesium oxide, aluminum oxide, or magnesium aluminum oxide. Furthermore, the tunnel barrier layer 14b made from an insulating film may be left behind at the side wall of the hole 310.

Next, the manufacturing method forms, with use of a CVD method or a sputtering method, a material 312 of the annular magnetic substance portion 141 and the cylindrical magnetic substance portions 143 and 144 on the bottom surface and side surface of the hole 310. This results in the annular magnetic substance portion 141 being formed on the tunnel barrier layer 14b and the cylindrical magnetic substance portions 143 and 144 being formed on the side surface of the hole 310. The material 312 to be used is, for example, permalloy.

Figure 16:
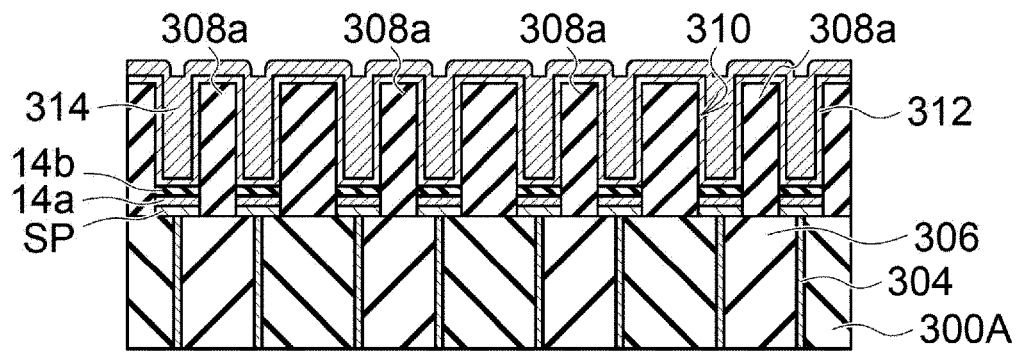

Next, as illustrated in FIG. 16, the manufacturing method embeds a material 314 of the non-magnetic substance portion 145 into the hole 310. The material 314 to be used is, for example, a non-magnetic conductive metal, such as copper or tungsten.

Figure 17:
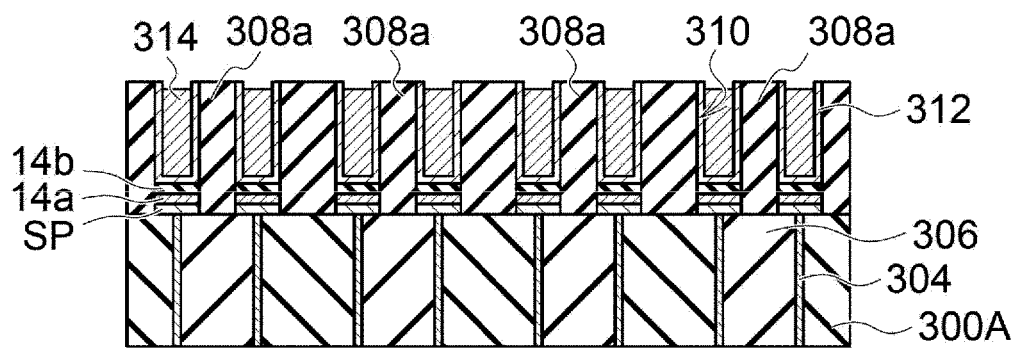

Next, as illustrated in FIG. 17, the manufacturing method polishes, with use of a CMP method, the materials 314 and 312 until the surface of the insulating film 308 is exposed.

Next, the manufacturing method selectively etches, with use of a wet etching method or an isotropic chemical dry etching (CDE) method, the material 314 with respect to the insulating film 308 and the material 312. This results in the upper surface of the material 314 being somewhat recessed with respect to the upper surface of the insulating film 308.

Figure 18:
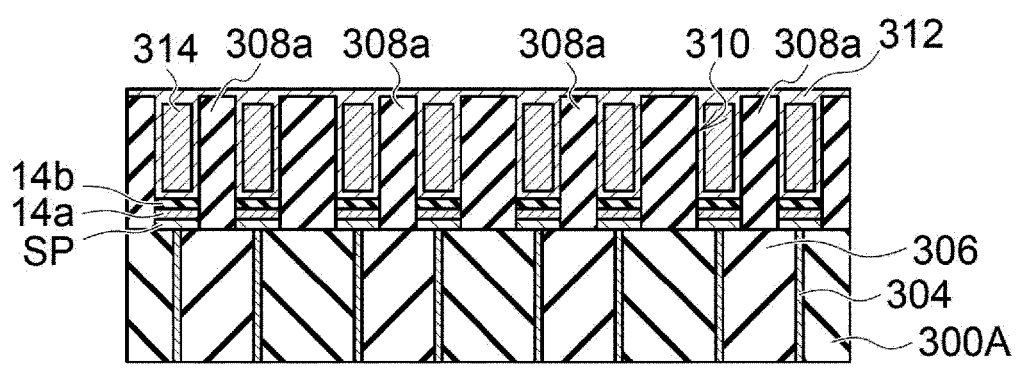

Next, as illustrated in FIG. 18, the manufacturing method forms a material 312 on the insulating film 308 and the material 314. This results in the material 312 being embedded in the recess on the material 314. The material 312 left behind in the recess on the material 314 becomes an annular magnetic substance portion 142 in a later process.

Figure 19:
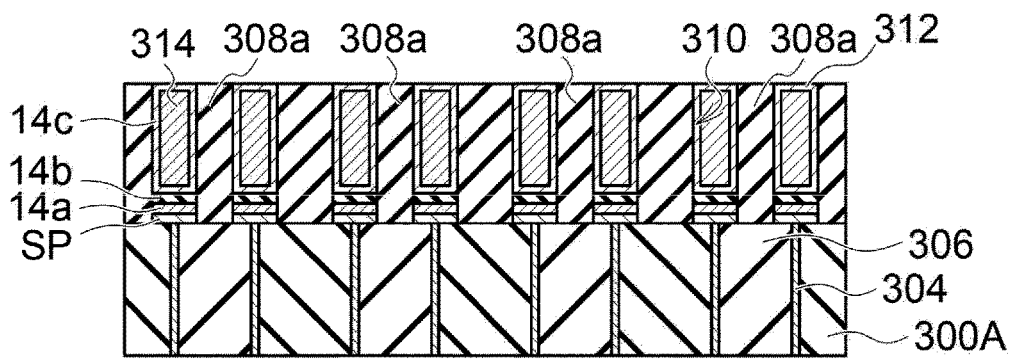

Next, as illustrated in FIG. 19, the manufacturing method polishes, with use of a CMP method, the material 312 until the insulating film 308 is exposed. This enables, while leaving behind the material 312 in the recess on the material 314, removing the material 312 on the insulating film 308. This results in the fixed portion 14c, which forms the annular magnetic substance portions 141 and 142 and the cylindrical magnetic substance portions 143 and 144, as illustrated in FIG. 6A to FIG. 7C. The non-magnetic substance portion 145 is provided inside the fixed portion 14c.

After that, for example, the vertical thin film transistor 18 and the bit line BL are formed and the yoke 25 and the field line FL are formed on the side of the second end portion 11b of the magnetic member ML, so that the magnetic memory is completed.

In this way, the fixed portion 14c is able to be formed with use of an existing semiconductor manufacturing process. According to a manufacturing method in the present embodiment, since the fixed portion 14c forms an annular magnetic circuit such as those illustrated in FIG. 5 to FIG. 7C, it is possible to stabilize the magnetization direction even with use of, for example, a material relatively high in heatproof temperature, such as permalloy. Accordingly, for example, after formation of the fixed portion 14c, it becomes possible to use LTPS as the vertical thin film transistor 18 for a channel.

Second Embodiment

Figure 20:
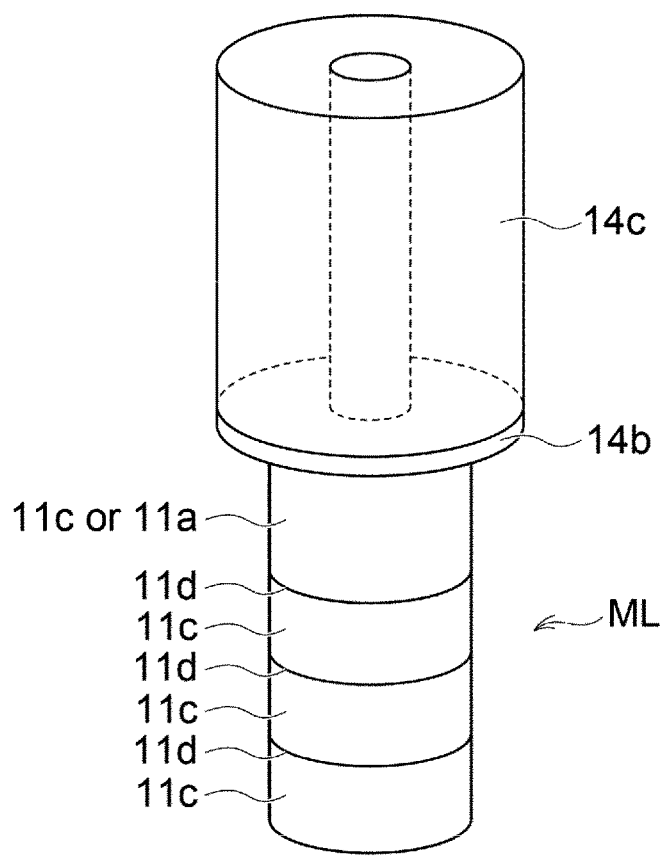
FIG. 20 is a perspective view illustrating a magnetic memory according to a second embodiment.
Figure 20:
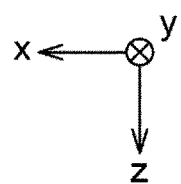
Figure 21:
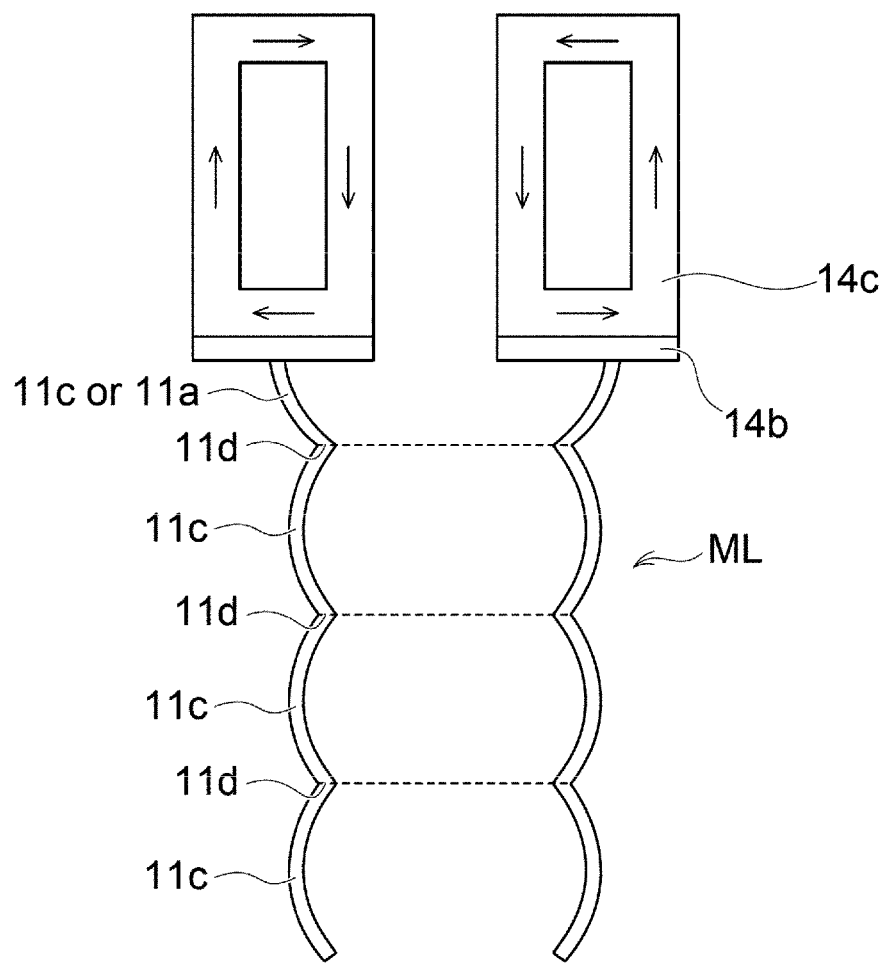
FIG. 21 is a cross-sectional view illustrating a magnetic memory according to a second embodiment.

FIG. 20 is a perspective view illustrating a magnetic memory according to a second embodiment. FIG. 21 is a cross-sectional view illustrating the magnetic memory according to the second embodiment.

In the second embodiment, the spacer layer SP and the free layer 14a are omitted. Accordingly, the fixed portion 14c lies adjacent to the first end portion 11a of the magnetic member ML via the tunnel barrier layer 14b. The other elements of the second embodiment are similar to those of the first embodiment. Accordingly, the second embodiment is able to attain an advantageous effect similar to that of the first embodiment.

In the second embodiment, the first end portion 11a of the magnetic member ML or the region 11c adjacent to the first end portion 11a (hereinafter referred to as a "region 11a or 11c") serves a function similar to that of a free layer. Accordingly, in a read operation, the resistance of each of the magnetic member ML and the fixed portion 14c changes according to the magnetization direction (e.g., an outward radial direction leading from the central axis of the magnetic member ML or an inward radial direction) of the region 11a or 11c of the magnetic member ML. Thus, the region 11a or 11c and the fixed portion 14c function as a magnetoresistive element. With this function, a case where the resistive state of the magnetoresistive element is high corresponds to, for example, a state in which the respective magnetization directions of the region 11a or 11c and the fixed portion 14c differ from each other (for example, an antiparallel state), and a case where the resistive state of the magnetoresistive element is low corresponds to a state in which the respective magnetization directions of the region 11a or 11c and the fixed portion 14c are the same (for example, a parallel state). The other operations of the second embodiment are similar to those of the first embodiment.

Moreover, a manufacturing method for the magnetic memory according to the second embodiment may be a method obtained by omitting formation of the spacer SP and the free layer 14a from the manufacturing method described in the first embodiment. Therefore, the magnetic memory according to the second embodiment is relatively easy in a manufacturing method and is shortened in a manufacturing process.

Third Embodiment

Figure 22:
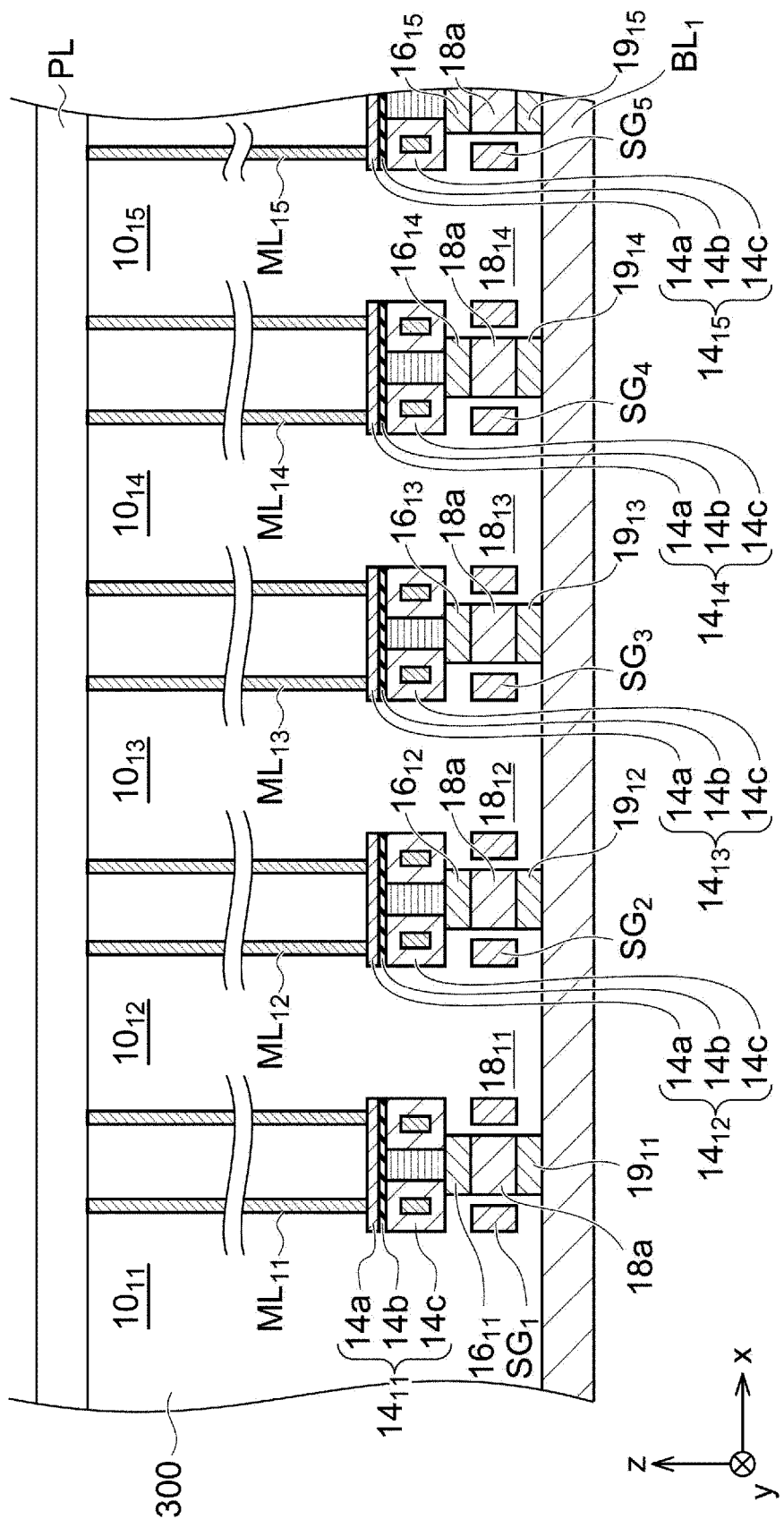
FIG. 22 is a cross-sectional view illustrating a magnetic memory according to a third embodiment.

FIG. 22 is a cross-sectional view illustrating a magnetic memory according to a third embodiment.

The magnetic memory according to the third embodiment has a configuration in which a spin transfer torque-magnetoresistive random access memory (STT-MRAM) is applied to the magnetoresistive element 14. In the STT-MRAM, read and write of data are performed via the magnetoresistive element 14 and the vertical thin film transistor 18. Accordingly, as illustrated in FIG. 22, the yoke 25 and the field line FL may be omitted. In the third embodiment, unlike the first embodiment, the non-magnetic conductive layer $12_{ij}$ and the spacer layer SP are omitted. Therefore, the free layer 14a is in direct contact with the magnetic member $ML_{ij}$. Additionally, the free layer 14a may be omitted in such a manner that the tunnel barrier layer 14b is in direct contact with the magnetic member $ML_{ij}$. It is desirable that the maximum outer diameter of the tunnel barrier layer 14b be the same as or larger than the outer diameter of the first end portion 11a of the magnetic member $ML_{ij}$. The other operations of the third embodiment only need to be similar to those of the first or second embodiment. Accordingly, the STT-MRAM in the third embodiment is also able to attain an advantageous effect similar to that in the first or second embodiment.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A magnetic memory, comprising:
   first and second wirings;
   a magnetic memory line including first and second portions and extending along a first direction, wherein the second portion is electrically connected to the first wiring; and
   a first magnetic member electrically connected to the first portion and the second wiring and including:
   first and second magnetic portions each having an annular shape and overlapping an end portion of the first portion of the memory line as viewed from the first direction, a third magnetic portion having a cylindrical shape and extending between an inner end of the first magnetic portion and an inner end of the second magnetic portion, and a fourth magnetic portion having a cylindrical shape and extending between an outer end of the first magnetic portion and an outer end of the second magnetic portion.

2. The magnetic memory according to claim 1, wherein the first and second magnetic portions are connected to each other via the third and fourth magnetic portions.

3. The magnetic memory according to claim 1, wherein the memory line has a cylindrical shape.

4. The magnetic memory according to claim 3, wherein a central axis of each of the first, second, third, and fourth magnetic portions lies inside a cylinder of the memory line as viewed from the first direction.

5. The magnetic memory according to claim 1, further comprising:
a first non-magnetic portion surrounded by the first, second, third, and fourth magnetic portions.

6. The magnetic memory according to claim 5, wherein the first non-magnetic portion is conductive.

7. The magnetic memory according to claim 1, further comprising:
a second non-magnetic portion inside a cylinder of the third magnetic portion.

8. The magnetic memory according to claim 7, wherein the second non-magnetic portion is made of an insulating material.

9. The magnetic memory according to claim 1, further comprising:
a fifth magnetic portion inside a cylinder of the third magnetic portion.

10. The magnetic memory according to claim 9, wherein the third and fifth magnetic portions are integrated into a single portion made of a same magnetic material.

11. The magnetic memory according to claim 1, further comprising:
a non-magnetic layer between the first portion of the memory line and the first magnetic member.

12. The magnetic memory according to claim 11, further comprising:
a sixth magnetic portion between the first portion of the memory line and the non-magnetic layer; and
a third non-magnetic portion between the first portion of the memory line and the sixth magnetic portion.

13. A magnetic memory, comprising:
first and second wirings;
a magnetic memory line including first and second portions and extending along a first direction, wherein the second portion is electrically connected to the first wiring; and
a first magnetic member electrically connected to the first portion and the second wiring and including:
first and magnetic portions each overlapping an end portion of the first portion of the memory line as viewed from the first direction,
a third magnetic portion having a columnar shape and extending between the first and second magnetic portions, and
a fourth magnetic portion having a cylindrical shape, extending between an outer circumference portion of the first magnetic portion and an outer circumference portion of the second magnetic portion, and surrounding the third magnetic portion.

14. The magnetic memory according to claim 13, wherein the first and second magnetic portions are connected to each other via the third and fourth magnetic portions.

15. The magnetic memory according to claim 13, wherein the memory line has a cylindrical shape.

16. The magnetic memory according to claim 15, wherein a central axis of each of the first, second, third, and fourth magnetic portions lies inside a cylinder of the memory line as viewed from the first direction.

17. The magnetic memory according to claim 13, further comprising:
a first non-magnetic portion surrounded by the first, second, third, and fourth magnetic portions.

18. The magnetic memory according to claim 13, further comprising:
a non-magnetic layer between the first portion of the memory line and the first magnetic member.

19. The magnetic memory according to claim 18, further comprising:
a sixth magnetic portion between the first portion of the memory line and the non-magnetic layer; and
a third non-magnetic portion between the first portion of the memory line and the sixth magnetic portion.

* * * * *